(12) United States Patent
Zhao et al.

(10) Patent No.: US 10,777,616 B2
(45) Date of Patent: Sep. 15, 2020

(54) PIXEL ARRANGEMENT STRUCTURE, PIXEL STRUCTURE AND PRODUCTION METHOD THEREOF, ARRAY SUBSTRATE, AND DISPLAY PANEL

(71) Applicant: BOE Technology Group Co., Ltd., Beijing (CN)

(72) Inventors: Dejiang Zhao, Beijing (CN); Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 60 days.

(21) Appl. No.: 16/329,196

(22) PCT Filed: Jul. 12, 2018

(86) PCT No.: PCT/CN2018/095413
§ 371 (c)(1),
(2) Date: Feb. 27, 2019

(87) PCT Pub. No.: WO2019/062278
PCT Pub. Date: Apr. 4, 2019

(65) Prior Publication Data
US 2020/0176522 A1    Jun. 4, 2020

(30) Foreign Application Priority Data
Sep. 30, 2017   (CN) .......................... 2017 1 0914842

(51) Int. Cl.
*H01L 27/32*  (2006.01)
*H01L 51/56*  (2006.01)
*H01L 51/00*  (2006.01)

(52) U.S. Cl.
CPC ...... *H01L 27/3218* (2013.01); *H01L 27/3213* (2013.01); *H01L 27/3246* (2013.01); *H01L 51/0005* (2013.01); *H01L 51/56* (2013.01)

(58) Field of Classification Search
CPC ............. H01L 27/3211; H01L 27/3213; H01L 27/3216; H01L 27/3218; H01L 27/3246; H01L 51/56
See application file for complete search history.

(56) References Cited

U.S. PATENT DOCUMENTS 9,984,604 B2   5/2018 Guo et al.
10,177,203 B2   1/2019 Chen et al.
(Continued)

FOREIGN PATENT DOCUMENTS

CN   104795012 A   7/2015
CN   106229300 A   12/2016
(Continued)

OTHER PUBLICATIONS

International Search Report (including English translation) and Written Opinion (including English translation of Box V) for International Application No. PCT/CN2018/095413, dated Sep. 27, 2018, 14 pages.
(Continued)

*Primary Examiner* — Thanhha S Pham
(74) *Attorney, Agent, or Firm* — Westman, Champlin & Koehler, P.A.

(57) ABSTRACT

This disclosure provides a pixel arrangement structure, a pixel structure and a production method thereof, an array substrate, and a display panel. The pixel arrangement structure comprises: a plurality of first pixel units and second pixel units which are arranged alternately in both of row direction and column direction; wherein each of the pixel units comprises nine zones forming an array of three rows by three columns, and there are first, second, and third sub-pixels, first and second retention regions, and an optional fourth sub-pixel in these zones, respectively.

17 Claims, 5 Drawing Sheets

|   | R | G |   | G | R |   | R | G |   | G | R |
|---|---|---|---|---|---|---|---|---|---|---|---|
| R | B | B | G | B | B | R | B | B | G | B | B |
| G | B | B | R | B | B | G | B | B | R | B | B |
|   | G | R |   | R | G |   | G | R |   | R | G |
| G | B | B | R | B | B | G | B | B | R | B | B |
| R | B | B | G | B | B | R | B | B | G | B | B |
|   | R | G |   | G | R |   | R | G |   | G | R |
| R | B | B | G | B | B | R | B | B | G | B | B |
| G | B | B | R | B | B | G | B | B | R | B | B |

(56) References Cited

U.S. PATENT DOCUMENTS

| | | | |
|---|---|---|---|
| 2005/0001542 A1* | 1/2005 | Kiguchi | H01L 27/3216 |
| | | | 313/504 |
| 2010/0039011 A1 | 2/2010 | Karaki et al. | |
| 2015/0287767 A1 | 10/2015 | Lee et al. | |
| 2016/0126298 A1 | 5/2016 | Chen | |

FOREIGN PATENT DOCUMENTS

| | | |
|---|---|---|
| CN | 106910760 A | 6/2017 |
| CN | 107068729 A | 8/2017 |
| CN | 107680990 A | 2/2018 |

OTHER PUBLICATIONS

First Office Action, including Search Report, for Chinese Patent Application No. 201710914842.1, dated Jul. 31, 2019, 14 pages.

* cited by examiner

PIXEL ARRANGEMENT STRUCTURE, PIXEL STRUCTURE AND PRODUCTION METHOD THEREOF, ARRAY SUBSTRATE, AND DISPLAY PANEL

CROSS-REFERENCE TO RELATED APPLICATION

This disclosure application is a Section 371 National Stage application of International Application No. PCT/CN2018/095413, filed on 12 Jul. 2018, and claims priority to Chinese Patent Application No. 201710914842.1 filed on Sep. 30, 2017, the contents of which are incorporated herein in their entirety by reference.

TECHNICAL FIELD

This disclosure relates to the technical field of display, and more particularly to a pixel arrangement structure, a pixel structure and a production method thereof, an array substrate, and a display panel.

BACKGROUND ART

A pixel unit of a display device typically comprises three sub-pixels which emit light independently and, for example, are a red (R) sub-pixel, a green (G) sub-pixel, and a blue (B) sub-pixel, respectively. By controlling the components of three colors (RGB) corresponding to the three sub-pixels in the pixel unit, respectively, the color and the brightness displayed by this pixel unit may be controlled. This pixel structure in which RGB sub-pixels are alternately arranged is referred to as an RGB arrangement. In addition, the pixel arrangement structure further includes a pentile arrangement in which the number of red and blue sub-pixels is reduced by a half.

At present, there are two relatively developed production approaches for sub-pixels of display devices such as organic light-emitting display devices (OLEDs) and quantum dot display device (QLEDs). One employs a manner of evaporation, and the other one employs a manner of inkjet printing. With respect to the two existing pixel structures described above, they are limited by conditions of facilities despite of production approaches. With respect to an evaporation method, the size of each sub-pixel is limited by the size of the opening of a mask plate. With respect to an inkjet printing method, the size of each sub-pixel is limited by the size of the orifice size of a print head.

SUMMARY OF THE INVENTION

In one aspect, this disclosure provides a pixel arrangement structure, comprising:

a plurality of first pixel units and second pixel units which are arranged alternately in both of row direction and column direction;

wherein the first pixel unit comprises nine zones forming an array of three rows by three columns, wherein the three rows are sequentially row 1, row 2, and row 3, and the three columns are sequentially column 1, column 2, and column 3, wherein in the first pixel unit, a first retention region is in the zone of column 1, row 1, a first sub-pixel is in the zone of column 1, row 2, a second sub-pixel is in the zone of column 1, row 3, a first sub-pixel is in the zone of column 2, row 1, a second sub-pixel is in the zone of column 3, row 1, and four third sub-pixels are in the zone of column 2, row 2, the zone of column 2, row 3, the zone of column 3, row 2, and the zone of column 3, row 3, respectively, or two adjacent third sub-pixels and two adjacent fourth sub-pixels are in the zone of column 2, row 2, the zone of column 2, row 3, the zone of column 3, row 2, and the zone of column 3, row 3, respectively;

the second pixel unit comprises nine zones forming an array of three rows by three columns, wherein the three rows are sequentially row 1, row 2, and row 3, and the three columns are sequentially column 1, column 2, and column 3, and the rows and columns of the second pixel unit are aligned with the corresponding rows and columns of the adjacent first pixel unit, respectively, wherein in the second pixel unit, a second retention region is in the zone of column 1, row 1, a second sub-pixel is in the zone of column 1, row 2, a first sub-pixel is in the zone of column 1, row 3, a second sub-pixel is in the zone of column 2, row 1, a first sub-pixel is in the zone of column 3, row 1, and four third sub-pixels are in the zone of column 2, row 2, the zone of column 2, row 3, the zone of column 3, row 2, and the zone of column 3, row 3, respectively, or two adjacent third sub-pixels and two adjacent fourth sub-pixels are in the zone of column 2, row 2, the zone of column 2, row 3, the zone of column 3, row 2, and the zone of column 3, row 3, respectively.

Optionally, the first sub-pixel, the second sub-pixel, and the third sub-pixel are a red sub-pixel, a green sub-pixel, and a blue sub-pixel, respectively, and when the pixel arrangement structure comprises a fourth sub-pixel, the fourth sub-pixel is a white sub-pixel.

Optionally, shapes of the first sub-pixel, the second sub-pixel, the third sub-pixel, and the first and second retention regions are all rectangular, and when the pixel arrangement structure comprises a fourth sub-pixel, the fourth sub-pixel is rectangular.

Optionally, at least one of four first sub-pixels adjacent to the first retention region extends to the zone where the first retention region is located, and/or at least one of four second sub-pixels adjacent to the second retention region extends to the zone where the second retention region is located.

Optionally, the sub-pixels in the zones of column 1, row 2, column 1, row 3, column 2, row 2, and column 3, row 3 of the first pixel unit constitute one pixel, and the sub-pixels in the zones of column 2, row 1, column 3, row 1, column 2, row 3, and column 3, row 2 of the first pixel unit constitute another pixel; or the sub-pixels in the zones of column 1, row 2, column 1, row 3, column 2, row 3, and column 3, row 2 of the first pixel unit constitute one pixel, and the sub-pixels in the zones of column 2, row 1, column 3, row 1, column 2, row 2, and column 3, row 3 of the first pixel unit constitute another pixel; and the sub-pixels in the zones of column 1, row 2, column 1, row 3, column 2, row 2, and column 3, row 3 of the second pixel unit constitute one pixel, and the sub-pixels in the zones of column 2, row 1, column 3, row 1, column 2, row 3, and column 3, row 2 of the second pixel unit constitute another pixel; or the sub-pixels in the zones of column 1, row 2, column 1, row 3, column 2, row 3, and column 3, row 2 of the second pixel unit constitute one pixel, and the sub-pixels in the zones of column 2, row 1, column 3, row 1, column 2, row 2, and column 3, row 3 of the second pixel unit constitute another pixel.

In another aspect, this disclosure provides a pixel structure, comprising:

a pixel defining layer; wherein the pixel defining layer defines a first color light-emitting layer, a second color light-emitting layer, and a third color light-emitting layer, so that the first color light-emitting layer, the second color light-emitting layer, and the third color light-emitting layer form the first sub-pixel, the second sub-pixel, and the third sub-pixel in the pixel arrangement structure according to claim 1, respectively, and when the pixel arrangement structure comprises a fourth sub-pixel, the pixel defining layer further defines a fourth color light-emitting layer, so that the fourth color light-emitting layer forms the fourth sub-pixel.

Optionally, the pixel structure further comprises a bank layer, which is on a pixel defining layer surrounding four first sub-pixels adjacent to a first retention region and on a pixel defining layer surrounding four second sub-pixels adjacent to a second retention region.

Optionally, the first color light-emitting layer, the second color light-emitting layer, and the third color light-emitting layer are a red light-emitting layer, a green light-emitting layer, and a blue light-emitting layer, respectively, and when a fourth color light-emitting layer is present, the fourth color light-emitting layer is a white light-emitting layer.

Optionally, shapes of the first color light-emitting layer, the second color light-emitting layer, the third color light-emitting layer, and the first and second retention regions are all rectangular, and when a fourth color light-emitting layer is present, a shape of the fourth color light-emitting layer is rectangular.

In yet another aspect, this disclosure further provides a production method for a pixel structure, comprising:

forming a pixel defining layer;

forming a first color light-emitting layer, a second color light-emitting layer, and a third color light-emitting layer in ranges defined by the pixel defining layer, so that the first color light-emitting layer, the second color light-emitting layer, and the third color light-emitting layer form the first sub-pixel, the second sub-pixel, and the third sub-pixel in the pixel arrangement structure according to claim 1, respectively, and when the pixel arrangement structure comprises a fourth sub-pixel, the production method further comprises forming a fourth color light-emitting layer in a range defined by the pixel defining layer, so that the fourth color light-emitting layer form the fourth sub-pixel.

Optionally, this production method comprises:

forming the first color light-emitting layer by an evaporation method using a first mask plate, wherein an evaporation opening of the first mask plate is configured to form four first sub-pixels surrounding a first retention region.

Optionally, the production method further comprises:

after evaporation of the first color light-emitting layer, moving the first mask plate, and forming the second color light-emitting layer by an evaporation method to form four second sub-pixels surrounding a second retention region by the evaporation opening.

Optionally, this production method comprises:

forming the third color light-emitting layer by an evaporation method using a second mask plate, wherein an evaporation opening of the second mask plate is configured to form at least two adjacent third sub-pixels.

Optionally, this production method comprises:

after forming the pixel defining layer, forming a bank layer, which is on a pixel defining layer surrounding four first sub-pixels adjacent to a first retention region and on a pixel defining layer surrounding four second sub-pixels adjacent to a second retention region; and forming the first color light-emitting layer and the second color light-emitting layer in a zone comprising a first sub-pixel and a zone comprising a second sub-pixel surrounded by the bank layer, respectively, by an inkjet printing method.

Optionally, the production method further comprises:

forming the third color light-emitting layer in a zone comprising a third sub-pixel surrounded by the bank layer by an inkjet printing method.

In yet another aspect, this disclosure provides an array substrate, comprising the pixel structure as described above.

In yet another aspect, this disclosure provides a display panel, comprising the array substrate as described above.

DESCRIPTION OF DRAWINGS

Specific embodiments of this disclosure are further illustrated in detail below in conjunction with the accompanying drawings;

FIG. 1 shows a schematic diagram of a pixel structure in an Example of this disclosure.

FIG. 2 shows a schematic diagram of a first pixel unit in a pixel structure in an Example of this disclosure.

FIG. 3 shows a schematic diagram of a second pixel unit in a pixel structure in an Example of this disclosure.

DESCRIPTION OF EMBODIMENTS

Figure 4:
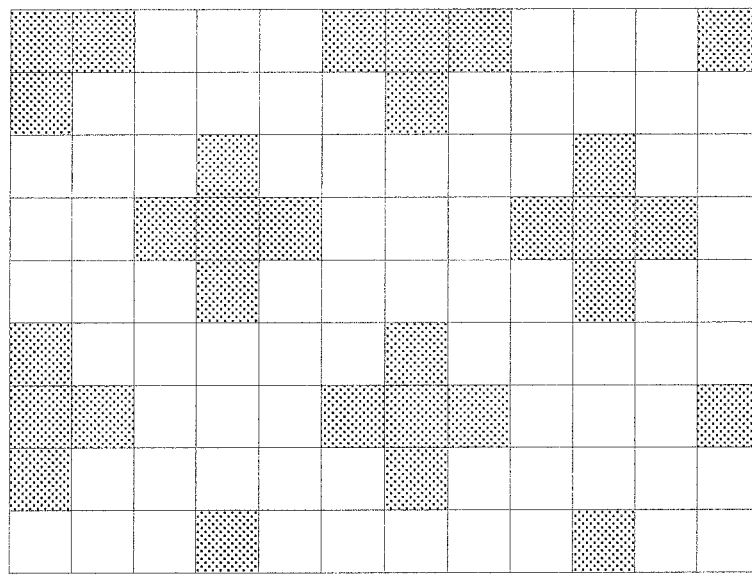
FIG. 4 and FIG. 5 show schematic diagrams of a mask plate used in an evaporation process in an Example of this disclosure.

In order to illustrate this disclosure more clearly, this disclosure is further illustrated below in conjunction with preferable Examples and accompanying drawings. Similar members in the accompanying drawings are represented by the same reference numerals. As to be understood by those skilled in the art, those specifically described are illustrative and non-limiting, and the protection scope of this disclosure should not be limited thereby.

Figures 1, 2, 3:
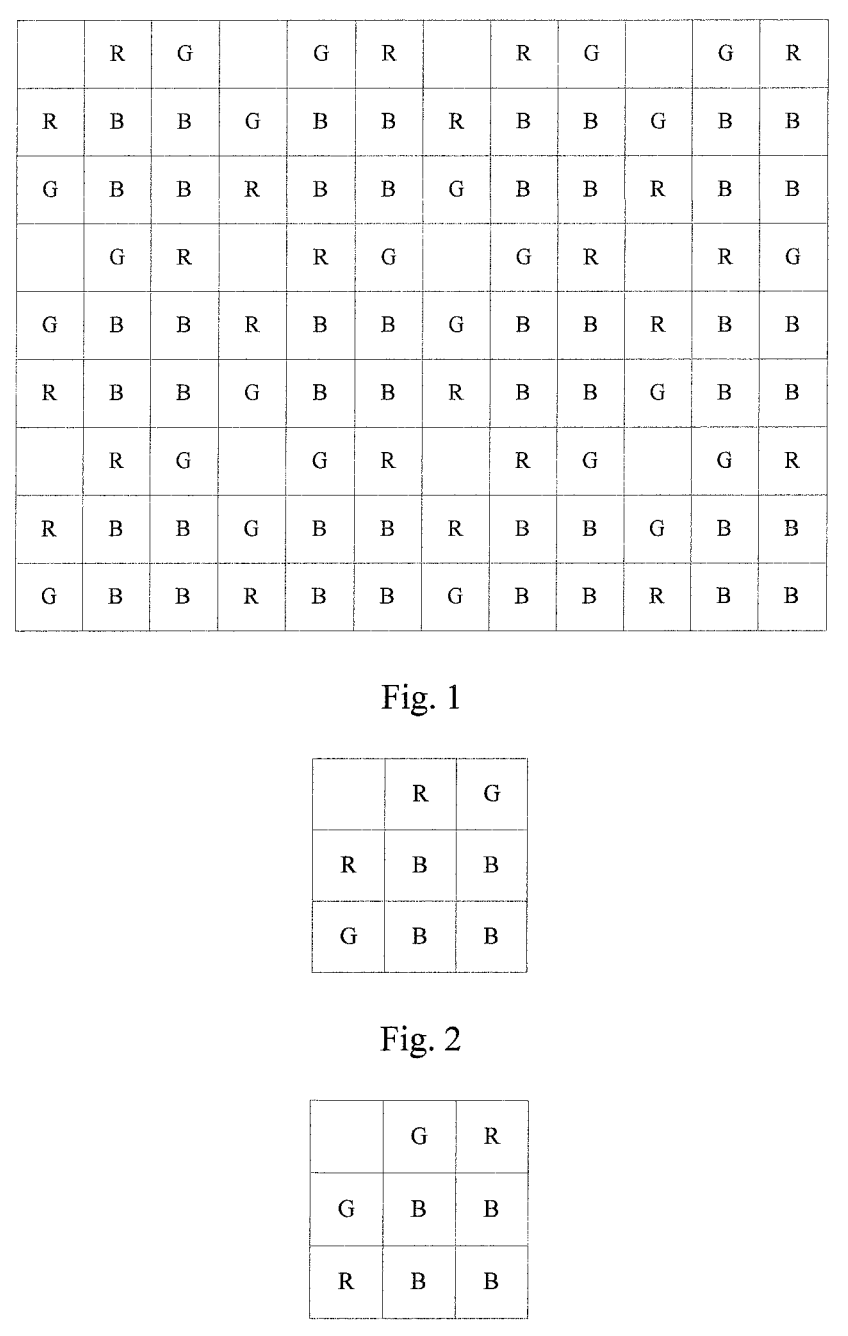

As shown in FIGS. 1-3, an Example of this disclosure provides a pixel arrangement structure, comprising: a plurality of first pixel units and second pixel units which are arranged alternately in both of row direction and column direction. For example, the pixel arrangement structure as shown in FIG. 1 is formed by alternately arranging the first pixel unit of FIG. 2 and the second pixel unit of FIG. 3 in both of row direction and column direction.

The first pixel unit comprises nine zones forming an array of three rows by three columns, wherein the three rows are sequentially row 1, row 2, and row 3, and the three columns are sequentially column 1, column 2, and column 3, wherein in the first pixel unit, a first retention region is in the zone of column 1, row 1, a first sub-pixel is in the zone of column 1, row 2, a second sub-pixel is in the zone of column 1, row 3, a first sub-pixel is in the zone of column 2, row 1, a second sub-pixel is in the zone of column 3, row 1, and four third sub-pixels are in the zone of column 2, row 2, the zone of column 2, row 3, the zone of column 3, row 2, and the zone of column 3, row 3, respectively, or two adjacent third sub-pixels and two adjacent fourth sub-pixels are in the zone of column 2, row 2, the zone of column 2, row 3, the zone of column 3, row 2, and the zone of column 3, row 3, respectively.

Each zone of the array of three rows by three columns described herein is rectangular. In an example, the nine zones may be of the same square, but this disclosure is not limited thereto.

On the basis of symmetry, the arrangement order of the rows and the columns described in this disclosure may be in any direction. For example, row 1, row 2, and row 3 may be arranged sequentially from top to bottom, but may also be arranged sequentially from bottom to top. Likewise, column 1, column 2, and column 3 may be arranged sequentially from left to right, but may also be arranged sequentially from right to left. In this disclosure, illustration is made by using top left as a starting point. However, on the basis of symmetry, this disclosure is not limited thereto.

Sub-pixels and retention regions are in specified zones. The sub-pixels and the retention regions in the zones may be rectangular, but may also be of other shapes. However, the array of the zones where the sub-pixels and the retention regions are located always complies with the form of three rows by three columns.

Rows and columns of the second pixel unit are aligned with the corresponding rows and columns of the adjacent first pixel unit, respectively. In other words, grids of the arrays in the two pixel units are the same. In this way, even distribution of sub-pixels may be ensured.

In one embodiment, those in the zone of column 2, row 2, the zone of column 2, row 3, the zone of column 3, row 2, and the zone of column 3, row 3 of the first pixel unit or the second pixel unit are all third pixels. At this time, the pixel array of this disclosure emits light in a mode of three sub-pixels.

In another embodiment, Those in the zone of column 2, row 2, the zone of column 2, row 3, the zone of column 3, row 2, and the zone of column 3, row 3 of the first pixel unit or the second pixel unit are two third pixels and two fourth pixels, wherein the two third pixels are adjacent and the two fourth pixels are adjacent. At this time, the pixel array of this disclosure emits light in a mode of four sub-pixels. In view of light emission evenness of constituent pixels, the third pixel and the fourth pixel are not distributed in a diagonal form.

This disclosure is illustrated by taking an example in which the first sub-pixel is red, the second sub-pixel is green, and the third sub-pixel is blue. However, this invention is not limited thereto. The blue sub-pixel has a poor light emission capacity compared to red and green sub-pixels, and therefore may have a larger area.

In one embodiment, the pixel arrangement structure comprises: a plurality of first pixel units and second pixel units which are arranged alternately in both of row direction and column direction;

the first pixel unit comprises: a first retention region, a first sub-pixel, and a second sub-pixel, arranged sequentially in column 1 of the first pixel unit; a first sub-pixel and two third sub-pixels arranged sequentially in column 2 of the first pixel unit; a second sub-pixel and two third sub-pixels arranged sequentially in column 3 of the first pixel unit; and the second pixel unit comprises: a second retention region, a second sub-pixel, and a first sub-pixel arranged sequentially in column 1 of the second pixel unit; a second sub-pixel and two third sub-pixels arranged sequentially in column 2 of the second pixel unit; a first sub-pixel and two third sub-pixels arranged sequentially in column 3 of the second pixel unit;

to allow the first retention region, the first sub-pixel in the first pixel unit adjacent to the first retention region, and the first sub-pixel in the second pixel unit adjacent to the first retention region to form a first regular pattern, to allow the second retention region, the second sub-pixel in the second pixel unit adjacent to the second retention region, and the second sub-pixel in the first pixel unit adjacent to the second retention region to form a first regular pattern, and to allow the third sub-pixels in the first pixel unit and the second pixel unit each form a second regular pattern.

In an example as shown in FIG. 2, the first pixel unit comprises: a retention region, a red sub-pixel, and a green sub-pixel, arranged sequentially in column 1 of the first pixel unit; a red sub-pixel and two blue sub-pixels arranged sequentially in column 2 of the first pixel unit; a green sub-pixel and two blue sub-pixels arranged sequentially in column 3 of the first pixel unit.

In an example as shown in FIG. 3, the second pixel unit comprises: a retention region, a green sub-pixel, and a red sub-pixel, arranged sequentially in column 1 of the second pixel unit; a green sub-pixel and two blue sub-pixels arranged sequentially in column 2 of the second pixel unit; a red sub-pixel and two blue sub-pixels arranged sequentially in column 3 of the second pixel unit.

Figure 11:
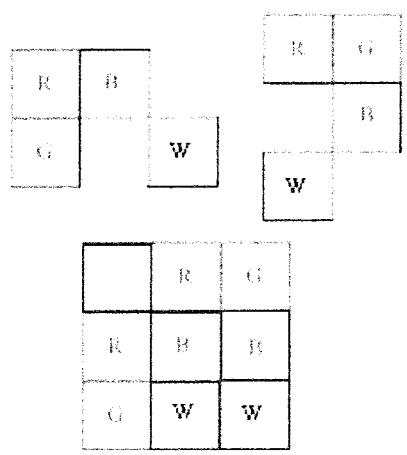
FIG. 11 shows a schematic diagram of a first pixel unit in RGWB mode contained in an Example of this disclosure.

In an example as shown in FIG. 11, one pixel unit comprises two red sub-pixels, two green sub-pixels, two blue sub-pixels, and two white sub-pixels, wherein the two blue sub-pixels are adjacent to each other and the two white sub-pixels are adjacent to each other.

The retention region stated herein refers to a region which will not emit light in practical display. That is, the retention region in the first pixel unit will not emit red light, and the retention region in the second pixel unit will not emit green light. In other words, the retention region is a region which does not contain any light-emitting sub-pixel. This will be further illustrated in the production method introduced hereinafter.

By means of such an arrangement structure, the red sub-pixels in the first pixel unit and the red sub-pixels in the second pixel unit adjacent to the first pixel unit, together with the retention region, form a regular pattern, which is a cross shape in this Example; and the green sub-pixels in the second pixel unit and the green sub-pixels in the first pixel unit adjacent to the second pixel unit, together with the retention region, form a regular pattern, which is also a cross shape in this Example; and the blue sub-pixels in either the first pixel unit or the second pixel unit form a regular pattern, which is rectangular in this Example.

By the pixel arrangement structure formed in this Example, adjacent pixels are allowed to be combined in the same color. That is, adjacent sub-pixels in the same color are combined to be a regular structure which has a larger size than that of a single RGB sub-pixel. For example, adjacent red sub-pixels are combined to be a cross shape, adjacent green sub-pixels are combined to be a cross shape, and adjacent blue sub-pixels are combined to be a rectangular shape. This obviously has a larger size than that of a single RGB sub-pixel. In production of practical processes, the process difficulty may be greatly reduced so as to obtain a relatively high resolution, no matter whether a pixel is produced in a manner of evaporation or inkjet printing. Furthermore, upon display, the display chromaticity uniformity of the pixel structure is better.

Optionally, the first sub-pixel, the second sub-pixel, the third sub-pixel, and the fourth sub-pixel are a red sub-pixel, a green sub-pixel, a blue sub-pixel, and a white sub-pixel, respectively, wherein the white sub-pixel is optional.

A scheme in which no white sub-pixel is contained is taken as an example, wherein adjacent red or green sub-pixels are arranged to be a cross shape, and adjacent blue sub-pixels are arranged to be a rectangular shape. As can be known by those skilled in the art, the positions of the red and green sub-pixels in the first pixel unit and the second pixel unit may be interchangeable, and such an interchange is substantially the interchange of the positions of the arranged first pixel unit and second pixel unit. In this way, white light may be displayed in a manner of RGBB.

The pixel structure of this Example is suitable for high-resolution products, particularly products having 600 ppi or more.

Furthermore, as can be known by those skilled in the art, four sub-pixels are used and white light may be displayed in a manner of RGWB, under the teachings of this disclosure. In this scheme, it is only required to modify two adjacent sub-pixels of four adjacent blue sub-pixels to be white sub-pixels. In this case, the advantages in the production and the resolution of red and green sub-pixels may be still achieved. However, in this case, the simplification of the production process of blue sub-pixels will be partly compromised, compared to the RGBB mode of this disclosure.

In this Example, the shapes of the red sub-pixel, the green sub-pixel, and the blue sub-pixel are all rectangular shapes, which are easily produced. In terms of process, it is simple and feasible. As can be known by those skilled in the art, the sub-pixels and the retention regions may also be of other shapes as long as they are in specified zones constituting the array of three rows by three columns, under the teachings of this disclosure. The combination of adjacent sub-pixels in the same color may be achieved by such an array, and the size thereof is larger than that of a single RGB sub-pixel. In other words, red and green sub-pixels may form a regular cross shape, blue sub-pixels may form a regular rectangular shape, or sub-pixels may also form regular patterns of other shapes, as long as the combination of adjacent sub-pixels in the same color having a larger size than that of a single RGB sub-pixel may be achieved. For the purpose of simplicity and clearness, three colors of RGB are still taken as examples in subsequent Examples.

Furthermore, in this Example, at least one of four red sub-pixels adjacent to the retention region in the first pixel unit extends to the zone where the retention region is located. At least one of four green sub-pixels adjacent to the retention region in the second pixel unit extends to the zone where the retention region is located. In this way, the size of the red sub-pixel or the green sub-pixel adjacent to the retention region may be adjusted.

The pixel array of this disclosure may be appropriately divided into pixels. For the purpose of normal display, it is required to ensure that each pixel comprises three sub-pixels (or four sub-pixels), and sub-pixels in each pixel are substantially in continuous arrangement.

Figure 9A:
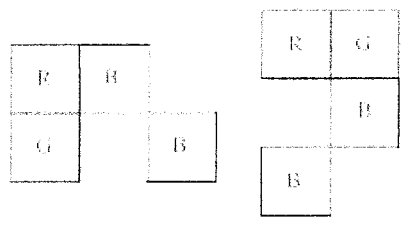
FIG. 9 shows a pixel contained in a first pixel unit in an Example of this disclosure.
Figure 9B:
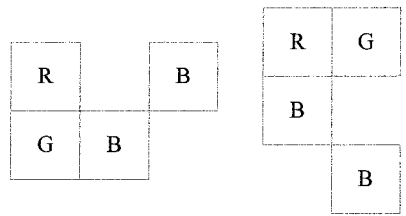
Figure 10A:
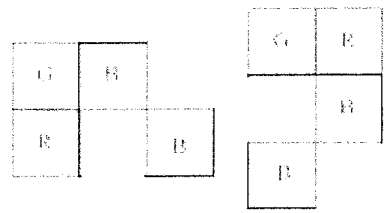
FIG. 10 shows a pixel contained in a second pixel unit in an Example of this disclosure.
Figure 10B:
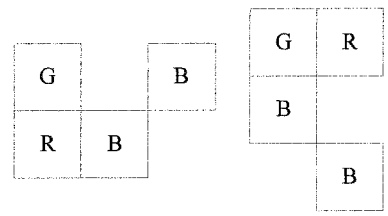

In one embodiment of this disclosure, the sub-pixels in the zones of column 1, row 2, column 1, row 3, column 2, row 2, and column 3, row 3 of the first pixel unit constitute one pixel (see left panel of FIG. 9(a)), and the sub-pixels in the zones of column 2, row 1, column 3, row 1, column 2, row 3, and column 3, row 2 of the first pixel unit constitute another pixel (see right panel of FIG. 9(a)); or the sub-pixels in the zones of column 1, row 2, column 1, row 3, column 2, row 3, and column 3, row 2 of the first pixel unit constitute one pixel (see left panel of FIG. 9(b)), and the sub-pixels in the zones of column 2, row 1, column 3, row 1, column 2, row 2, and column 3, row 3 of the first pixel unit constitute another pixel (see right panel of FIG. 9(b)); and the sub-pixels in the zones of column 1, row 2, column 1, row 3, column 2, row 2, and column 3, row 3 of the second pixel unit constitute one pixel (see left panel of FIG. 10(a)), and the sub-pixels in the zones of column 2, row 1, column 3, row 1, column 2, row 3, and column 3, row 2 of the second pixel unit constitute another pixel (see right panel of FIG. 10(a)); or the sub-pixels in the zones of column 1, row 2, column 1, row 3, column 2, row 3, and column 3, row 2 of the second pixel unit constitute one pixel (see left panel of FIG. 10(b)), and the sub-pixels in the zones of column 2, row 1, column 3, row 1, column 2, row 2, and column 3, row 3 of the second pixel unit constitute another pixel (see right panel of FIG. 10(b)).

Of course, in a display mode of four sub-pixels (RGWB), one blue pixel may be replaced by on white pixel in each pixel in the embodiment described above. FIG. 11 shows a pixel unit in RGWB mode, which comprises two pixels, each of which comprises one red sub-pixel, one green sub-pixel, one blue sub-pixel, and one white sub-pixel.

Another Example of this disclosure provides a production method for a pixel structure, comprising:

forming a pixel defining layer;

forming a first color light-emitting layer, a second color light-emitting layer, and a third color light-emitting layer in ranges defined by the pixel defining layer, so that the first color light-emitting layer, the second color light-emitting layer, and the third color light-emitting layer form the first sub-pixel, the second sub-pixel, and the third sub-pixel in the pixel arrangement structure according to claim 1, respectively, and when the pixel arrangement structure comprises a fourth sub-pixel, the production method further comprises forming a fourth color light-emitting layer in a range of defined by the pixel defining layer, so that the fourth color light-emitting layer form the fourth sub-pixel.

An embodiment of the production method of this disclosure comprises: forming an anode layer and a pixel defining layer on a base;

forming a first color light-emitting layer, a second color light-emitting layer, and a third color light-emitting layer in a region defined by the pixel defining layer, wherein a first regular pattern is formed by adjacent four first color light-emitting layers and a first retention region surrounded by the adjacent first color light-emitting layers, a first regular pattern is formed by adjacent four second color light-emitting layers and a second retention region surrounded by the adjacent second color light-emitting layers, and a second regular pattern is formed by adjacent four third color light-emitting layers.

Specifically, a base is provided, and the base may be a light-transmitting glass or an opaque material, according to the requirements for the display device which is of top emission, bottom emission, or double-side emission.

A drive transistor, an anode layer, a pixel defining layer, and the like are formed on the base. These are conventional process steps for a display device, and verbose words are omitted herein.

A red light-emitting layer, a green light-emitting layer, and a blue light-emitting layer are formed in a region defined by the pixel defining layer, wherein a first regular pattern is formed by adjacent four red color light-emitting layers and a first retention region surrounded by the adjacent red color light-emitting layers, a first regular pattern is formed by adjacent four green color light-emitting layers and a second retention region surrounded by the adjacent green color light-emitting layers, and a second regular pattern is formed by adjacent four blue color light-emitting layers.

Furthermore, other process steps for a cathode, a passivation layer, and the like are next finished, and verbose words are omitted herein.

By the production method of this Example, adjacent pixels are allowed to be combined in the same color, that is, adjacent sub-pixels in the same color are combined to be a regular structure having a larger size than that of a single RGB sub-pixel, and therefore the process difficulty may be greatly reduced.

A production method for a pixel structure comprising white sub-pixels further comprises forming a white light-emitting layer.

The light-emitting layer may be an organic light-emitting material layer, quantum dot light-emitting layer, or the like.

In a specific example, the production method described above is achieved in a manner of evaporation.

In one embodiment, the production method may further comprise: forming the first color light-emitting layer by an evaporation method using a first mask plate, wherein an evaporation opening of the first mask plate is configured to form four first sub-pixels surrounding a first retention region.

It may further comprises: after evaporation of the first color light-emitting layer, moving the first mask plate, and forming the second color light-emitting layer by an evaporation method to form four second sub-pixels surrounding a second retention region by the evaporation opening.

It may further comprises: forming the third color light-emitting layer by an evaporation method using a second mask plate, wherein an evaporation opening of the second mask plate is configured to form at least two adjacent third sub-pixels.

In the case where four third sub-pixels are formed, an evaporation opening of the second mask plate is configured to form four adjacent third sub-pixels.

In the case where two third sub-pixels and two fourth sub-pixels are formed, if the third sub-pixel and the fourth sub-pixel have the same shape, the second mask plate may be used to form the fourth sub-pixel. Otherwise, a separate third mask plate may be used to form the fourth sub-pixel.

In an example, a first evaporation opening of the first mask plate is aligned with the first sub-pixels located in the first regular pattern, and the evaporation of the first light-emitting layer is performed;

the first mask plate is moved to allow the first evaporation opening is aligned with the second sub-pixels located in the first regular pattern, and the evaporation of the second light-emitting layer is performed;

a second evaporation opening of the second mask plate is aligned with the third sub-pixels located in the second regular pattern, and the evaporation of the third light-emitting layer is performed.

Figure 5:
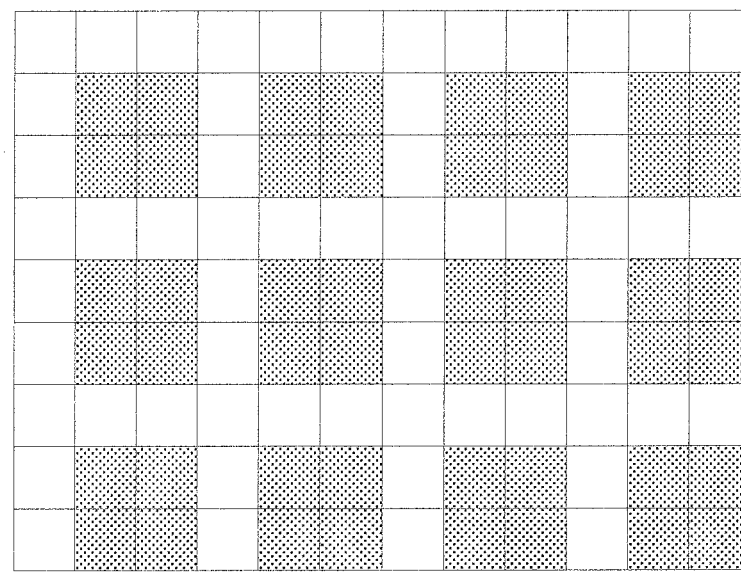

FIG. 4 and FIG. 5 show schematic diagrams of mask plates forming a cross-shaped pattern and a rectangular pattern, respectively. Those shown in the figures are positive plates. That is, regions filled with dots are open light-transmitting zones.

By using the mask plate as shown in FIG. 4, a cross-shaped opening is aligned with red sub-pixels in a cross, and evaporation of a red light-emitting layer is performed. As can be seen, the opening is a cross opening, and the difficulty of opening is greatly reduced and the difficulty of production is also greatly reduced compared to an opening which is aligned with an opening of a single sub-pixel.

By the process described above, although a red light-emitting layer and/or a green light-emitting layer are formed by a cross opening of a mask plate, in a zone where a retention region at the crossing part of a cross is located, no corresponding drive transistor is provided in the retention region and therefore the retention region does not emit light.

In this Example, since the regular pattern of cross shape formed by adjacent red sub-pixel and the regular pattern of cross shape formed by adjacent green sub-pixels in the pixel structure have the same size and shape, the mask plate as shown in FIG. 4 is moved to allow this cross-shaped opening is aligned with green sub-pixels in a cross and evaporation of a green light-emitting layer is performed. In this way, a red light-emitting layer and a green light-emitting layer may be each made by evaporation using one mask plate. One mask plate is saved and the cost is reduced.

By using the mask plate as shown in FIG. 5, a rectangular opening is aligned with blue sub-pixels in a rectangle, and evaporation of a blue light-emitting layer is performed. As can be seen, due to the rectangular opening, the difficulty of opening is greatly reduced and the difficulty of production is also greatly reduced compared to an opening which is aligned with a single sub-pixel.

By this scheme, the opening of the mask plate may be made to be larger than the opening of the mask plate corresponding to a single sub-pixel so as to reduce the difficulty of the process for producing an array substrate of a display device by using an evaporation process.

In another specific example, the production method described above is achieved in a manner of inkjet printing.

In one embodiment, the production method may further comprise: after forming the pixel defining layer, forming a bank layer, which is on a pixel defining layer surrounding four first sub-pixels adjacent to a first retention region and on a pixel defining layer surrounding four second sub-pixels adjacent to a second retention region; and forming the first color light-emitting layer and the second color light-emitting layer in a zone comprising a first sub-pixel and a zone comprising a second sub-pixel surrounded by the bank layer, respectively, by an inkjet printing method.

The bank layer certainly surrounds the zone comprising the third sub-pixels. Therefore, it may further comprise: forming the third color light-emitting layer in a zone comprising third sub-pixels surrounded by the bank layer by an inkjet printing method.

In an example, bank layers are formed on the pixel defining layer, including a first bank layer surrounding the first regular pattern and a second bank layer surrounding the second regular pattern;

the first color light-emitting layer and the second color light-emitting layer are printed in ranges surrounded by the first bank layer, and the third color light-emitting layer is printed in a range surrounded by the second bank layer.

Optionally, additional bank layers may be provided between column 2, row 2, column 2, row 3, column 3, row 2, and column 3, row 3 so as to inkjet-print the third color light-emitting layer and the fourth color light-emitting layer.

Figure 6A:
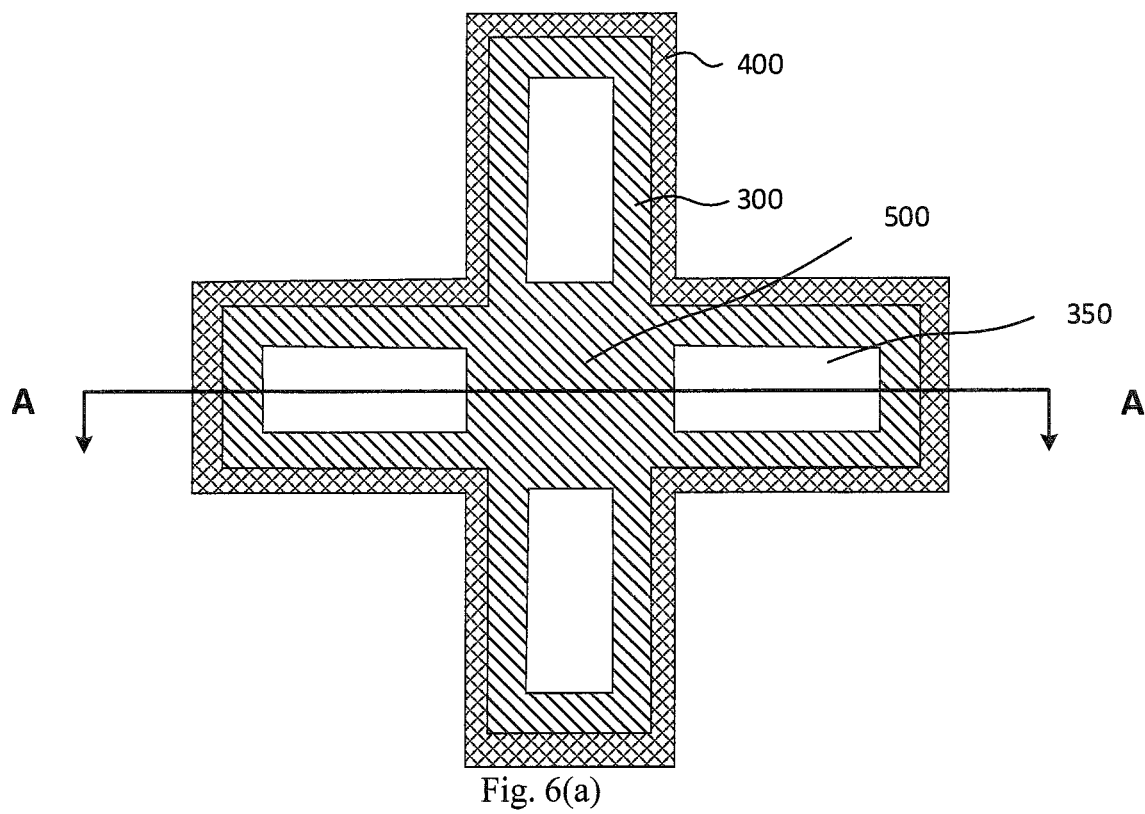
FIGS. 6(a)-(b) show schematic diagrams of a pixel defining layer surrounding a first or second pixel-free region and adjacent first or second pixels in an Example of this disclosure.

Forming a regular pattern of cross shape is taken as an example. As shown in FIGS. 6(*a*) and 6(*b*), FIG. 6(*b*) is a sectional view obtained along row A-A of FIG. 6(*a*). An anode layer 200 and a pixel defining layer 300 are formed on a base 100, a bank layer 400 is formed on the peripheral pixel defining layer corresponding to the light-emitting layer region, i.e., where an opening region 350 is formed, and the pixel defining layer surrounded by adjacent four light-emitting layers is referred to as a retention region 500.

Figure 6B:
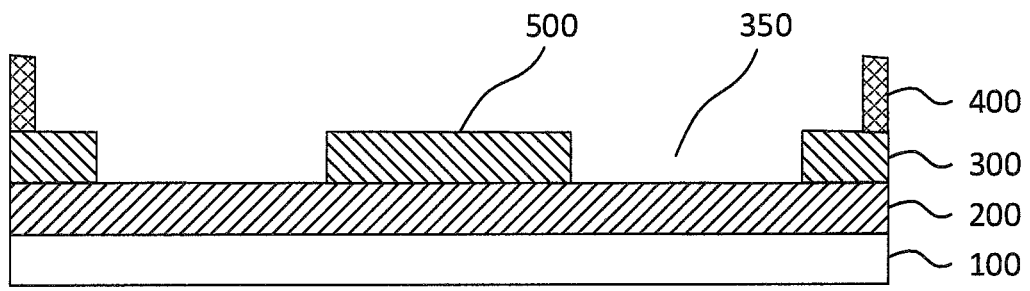
Figures 7A, 7B, 7C:
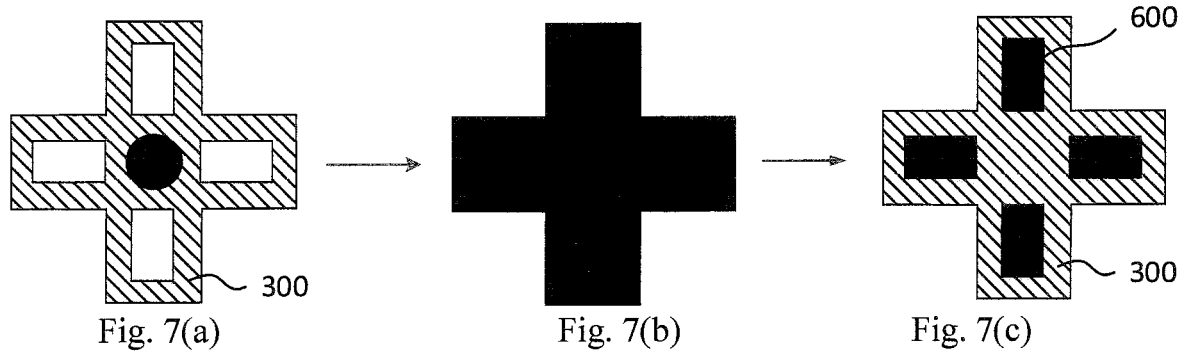
FIGS. 7(a)-(c) show schematic diagrams of printing a red light-emitting layer and a green light-emitting layer by means of inkjet printing in an Example of this disclosure.

As shown in FIG. 7, a red light-emitting layer and a green light-emitting layer are each printed in a range surrounded by the bank layer 400. As shown in FIG. 7(a), an ink droplet is dropped in an intermediate position (retention region) and then spread around to fill up all of the 4 sub-pixels (as shown in FIG. 7(b)), but will not overflow due to the block of the bank layer 400 and remains in the range surrounded by the bank layer 400. As shown in FIG. 7(c), it is then separated by the retention region 500 upon drying, and a light-emitting layer 600 is finally formed in the opening region 350 as shown in FIG. 6.

The retention region at the crossing part of a cross corresponds to a pixel defining layer. Although a red light-emitting layer and/or a green light-emitting layer may remain on this pixel defining layer by the process described above, the pixel defining layer is opaque so that the retention region does not emit light.

Figures 8A, 8B, 8C:
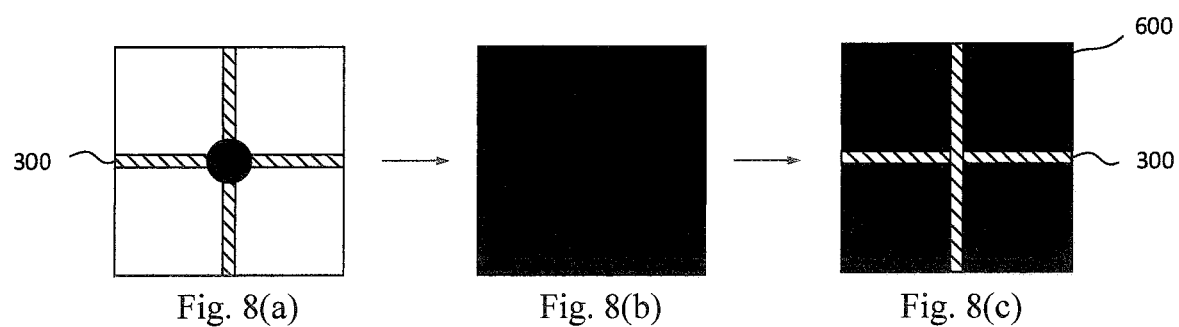
FIGS. 8(a)-(c) show schematic diagrams of printing a blue light-emitting layer by means of inkjet printing in an Example of this disclosure.

With respect to a regular pattern of rectangle, as shown in FIG. 8, a blue light-emitting layer is printed in a range surrounded by the bank layer. As shown in FIG. 8(a), an ink droplet is dropped in an intermediate position and then spread around to fill up all of the 4 sub-pixels (as shown in FIG. 8(b)), but will not overflow due to the block of the bank and remains in the range surrounded by the bank layer. Next, a light-emitting layer 600 is finally formed by drying, as shown in FIG. 8(c).

When a fourth sub-pixel is required to be formed, a bank layer may also be correspondingly added.

By this scheme, the orifice size of a nozzle may be made to be larger than the opening corresponding to a single sub-pixel so as to reduce the difficulty of the process for producing an array substrate of a display device by using an inkjet printing process.

Another Example of this disclosure provides a pixel structure, comprising a pixel defining layer; wherein the pixel defining layer defines a first color light-emitting layer, a second color light-emitting layer, and a third color light-emitting layer, so that the first color light-emitting layer, the second color light-emitting layer, and the third color light-emitting layer form the first sub-pixel, the second sub-pixel, and the third sub-pixel in the pixel arrangement structure as mentioned above, respectively, and when the pixel arrangement structure comprises a fourth sub-pixel, the pixel defining layer further defines a fourth color light-emitting layer, so that the fourth color light-emitting layer forms the fourth sub-pixel.

In one embodiment, the pixel structure comprise: a substrate;

an anode layer and a pixel defining layer, provided sequentially, along a direction away from the base;

a first color light-emitting layer, a second color light-emitting layer, and a third color light-emitting layer defined by a pixel defining layer, wherein a first regular pattern is formed by adjacent four first color light-emitting layers and a first retention region surrounded by the adjacent first color light-emitting layers, a first regular pattern is formed by adjacent four second color light-emitting layers and a second retention region surrounded by the adjacent second color light-emitting layers, and a second regular pattern is formed by adjacent four third color light-emitting layers.

In an example, as shown in FIGS. 6(b), 7(c), and 8(c), it, comprises:

a base 100;

an anode layer 200 and a pixel defining layer 300, provided sequentially, along a direction away from the base;

a red light-emitting layer, a green light-emitting layer, and a blue light-emitting layer defined by the pixel defining layer 300, wherein a regular pattern of cross shape is formed by adjacent four red color light-emitting layers and a retention region 500 surrounded by the adjacent red color light-emitting layers, a regular pattern of cross shape is formed by adjacent four green color light-emitting layers and a retention region 500 surrounded by the adjacent green color light-emitting layers, and a regular pattern of rectangle is formed by adjacent four blue light-emitting layers.

By the pixel structure of the Example of this disclosure, adjacent pixels are allowed to be combined in the same color, that is, adjacent sub-pixels in the same color are combined to be a regular structure having a larger size than that of a single RGB sub-pixel, and therefore the process difficulty may be greatly reduced.

Preferably, with respect to a pixel structure formed by an inkjet printing method, a bank layer 400 is further comprised, which is formed on the pixel defining layer of the cross-shaped structure surrounding a corresponding to red light-emitting layer, and is formed on the pixel defining layer of the cross-shaped structure surrounding a corresponding to green light-emitting layer.

In this example, a regular structure of cross shape is formed by adjacent four red color light-emitting layers and a retention region surrounded by the adjacent red color light-emitting layers, a regular structure of cross shape is formed by adjacent four green color light-emitting layers and a retention region surrounded by the adjacent green color light-emitting layers, and a regular structure of rectangle is formed by adjacent four blue light-emitting layers. The shape of the light-emitting layer is designed to be rectangular and thereby regular patterns of cross shape and rectangle are formed, which is therefore easily achieved in practical process.

As can be known by those skilled in the art, the light-emitting layers may be designed to be of other shapes by those skilled in the art so that another regular pattern may be formed by adjacent four light-emitting layers in the same color, under the teachings of this disclosure.

Another Example of this disclosure provides an array substrate, comprising the pixel structure in the Example of this disclosure described above. The red, green, and blue sub-pixels referred to in this Example correspond to the colors of the lights emitted by the light-emitting layer of the display device upon stimulated emission. If the color of the light emitted by the light-emitting layer is red, the red sub-pixel corresponds thereto. Similarly, if the color of the light emitted by the light-emitting layer is green, the green sub-pixel corresponds thereto. If the color of the light emitted by the light-emitting layer is blue, the blue sub-pixel corresponds thereto.

Since the array substrate of this Example comprises the pixel structure in the Example described above, adjacent pixels are allowed to be combined in the same color. That is, adjacent sub-pixels in the same color are combined to be a regular structure which has a larger size than that of a single RGB sub-pixel. The process difficulty may be greatly reduced so as to obtain a relatively high resolution, no matter whether the array substrate is produced in a manner of evaporation or inkjet printing. Furthermore, upon display, the display chromaticity uniformity of the pixel structure is better.

As can be known by those skilled in the art, the pixel structure corresponds to a display area, and a non-display area surrounding the display area further comprises various drive circuits. These all belong to the prior art in the art, and verbose words are omitted herein.

Another Example of this disclosure provides a display panel comprising the array substrate in the Example of this disclosure described above. This display panel may be an organic light-emitting display panel, or may also be, for example, a quantum dot display panel. Since the display panel of this Example comprises the pixel structure in one Example, adjacent pixels are allowed to be combined in the same color. That is, adjacent sub-pixels in the same color are combined to be a regular structure which has a larger size than that of a single RGB sub-pixel. The process difficulty may be greatly reduced so as to obtain a relatively high resolution, no matter whether the display panel is produced in a manner of evaporation or inkjet printing. Furthermore, upon display, the display chromaticity uniformity of the pixel structure is better.

Another Example of this disclosure provides a display method for the display panel in the Example of this disclosure described above, comprising:

dividing sub-pixels on an array substrate into a plurality of display units, wherein each of the display units comprises: a red sub-pixel and a green sub-pixel which are adjacent, a blue sub-pixel adjacent to the red sub-pixel or the green sub-pixel, and a blue sub-pixel at a distance of at most one sub-pixel from the red sub-pixel or the green sub-pixel; and displaying with one display unit as a unit.

By reasonably dividing the sub-pixels on the array substrate comprising the pixel structure described above into a plurality of display units, the display method provided in an Example of this disclosure may improve the utilization rate of the sub-pixels in the pixel structure and improve the display efficiency of the display units so as to improve the display resolution, and a display resolution of 1000 ppi or more may be achieved.

For example, the sub-pixels on the array substrate are divided into the display units comprised in the first pixel unit as shown in FIG. 9 and the display units comprised in the second pixel unit as shown in FIG. 10. This mode of division is merely an example. Another mode of division may be further included according to the principle of division described above that "each of the display units comprises: a red sub-pixel and a green sub-pixel which are adjacent, a blue sub-pixel adjacent to the red sub-pixel or the green sub-pixel, and a blue sub-pixel at a distance of at most one sub-pixel from the red sub-pixel or the green sub-pixel". Verbose words are omitted herein.

By this scheme, display in modes of RGBB, RGWB, and the like may be achieved upon display, and the display resolution is improved.

Clearly, the Examples of this disclosure described above are merely examples for the purpose of clearly illustration of this disclosure, rather than limitations to the embodiments of this disclosure. With respect to those of ordinary skill in the art, other different forms modifications and variations may be also made on the basis of the illustration described above. All of embodiments cannot be exhaustively exemplified herein. Any apparent modification or variation belonging to the extension from the technical solution of this disclosure is still within the scope protected by this disclosure.

What is claimed is:

1. A pixel arrangement structure, comprising:
a plurality of first pixel units and second pixel units which are arranged alternately in both of row direction and column direction;
wherein
each of the first pixel units comprises nine zones forming an array of three rows by three columns, wherein the three rows are sequentially row 1, row 2, and row 3, and the three columns are sequentially column 1, column 2, and column 3, wherein in the first pixel unit, a first retention region is in the zone of column 1, row 1, a sub-pixel of a first sub-pixel group is in the zone of column 1, row 2, a sub-pixel of a second sub-pixel group is in the zone of column 1, row 3, a sub-pixel of the first sub-pixel group is in the zone of column 2, row 1, a sub-pixel of the second sub-pixel is in the zone of column 3, row 1, and
four sub-pixels of a third sub-pixel group are in the zone of column 2, row 2, the zone of column 2, row 3, the zone of column 3, row 2, and the zone of column 3, row 3, respectively, of the array of the first pixel unit, or
two adjacent sub-pixels of the third sub-pixel group and two adjacent sub-pixels of a fourth sub-pixel group are in the zone of column 2, row 2, the zone of column 2, row 3, the zone of column 3, row 2, and the zone of column 3, row 3, respectively, of the array of the first pixel unit;
each of the second pixel units comprises nine zones forming an array of three rows by three columns, wherein the three rows are sequentially row 1, row 2, and row 3, and the three columns are sequentially column 1, column 2, and column 3, and the rows and columns of the second pixel unit are aligned with the corresponding rows and columns of the adjacent first pixel unit, respectively, wherein in the second pixel unit, a second retention region is in the zone of column 1, row 1, a sub-pixel of the second sub-pixel group is in the zone of column 1, row 2, a sub-pixel of the first subpixel group is in the zone of column 1, row 3, a sub-pixel of the second sub-pixel group is in the zone of column 2, row 1, a sub-pixel of the first pixel group is in the zone of column 3, row 1, and
four sub-pixels of the third sub-pixel group are in the zone of column 2, row 2, the zone of column 2, row 3, the zone of column 3, row 2, and the zone of column 3, row 3, respectively, of the array of the second pixel unit, or
two adjacent sub-pixels of the third sub-pixel group and two adjacent sub-pixels of the fourth sub-pixel group are in the zone of column 2, row 2, the zone of column 2, row 3, the zone of column 3, row 2, and the zone of column 3, row 3, respectively, of the array of the second pixel unit.

2. The pixel arrangement structure according to claim 1, wherein the first sub-pixel group, the second sub-pixel group, and the third sub-pixel group are a red sub-pixel group, a green sub-pixel group, and a blue sub-pixel group, respectively, and when the pixel arrangement structure comprises the fourth sub-pixel group, the fourth sub-pixel group is a white sub-pixel group.

3. The pixel arrangement structure according to claim 1, wherein shapes of the sub-pixels of the first sub-pixel group, the sub-pixels of the second sub-pixel group, the sub-pixels of the third sub-pixel group, and the first and second retention regions are all rectangular, and when the pixel arrangement structure comprises the sub-pixels of the fourth sub-pixel group, the sub-pixels of the four sub-pixel group are rectangular.

4. The pixel arrangement structure according to claim 1, wherein
at least one of four sub-pixels of the first sub-pixel group adjacent to the first retention region extends to the zone where the first retention region is located, and/or
at least one of four sub-pixels of the second sub-pixel group adjacent to the second retention region extends to the zone where the second retention region is located.

5. The pixel arrangement structure according to claim 1, wherein
the sub-pixels in the zones of column 1, row 2, column 1, row 3, column 2, row 2, and column 3, row 3 of the first pixel unit constitute one pixel, and the sub-pixels in the zones of column 2, row 1, column 3, row 1, column 2, row 3, and column 3, row 2 of the first pixel unit constitute another pixel; or the sub-pixels in the zones of column 1, row 2, column 1, row 3, column 2, row 3, and column 3, row 2 of the first pixel unit constitute the one pixel, and the sub-pixels in the zones of column 2, row 1, column 3, row 1, column 2, row 2, and column 3, row 3 of the first pixel unit constitute the another pixel; or
the sub-pixels in the zones of column 1, row 2, column 1, row 3, column 2, row 2, and column 3, row 3 of the second pixel unit constitute the one pixel, and the sub-pixels in the zones of column 2, row 1, column 3, row 1, column 2, row 3, and column 3, row 2 of the second pixel unit constitute the another pixel; or the sub-pixels in the zones of column 1, row 2, column 1, row 3, column 2, row 3, and column 3, row 2 of the second pixel unit constitute the one pixel, and the sub-pixels in the zones of column 2, row 1, column 3, row 1, column 2, row 2, and column 3, row 3 of the second pixel unit constitute the another pixel.

6. A pixel structure, comprising:
a pixel defining layer; wherein the pixel defining layer defines a first color light-emitting layer, a second color light-emitting layer, and a third color light-emitting layer, so that the first color light-emitting layer, the second color light-emitting layer, and the third color light-emitting layer form the first sub-pixel group, the second sub-pixel group, and the third sub-pixel group in the pixel arrangement structure according to claim 1, respectively,
and when the pixel arrangement structure comprises a fourth sub-pixel group, the pixel defining layer further defines a fourth color light-emitting layer, so that the fourth color light-emitting layer forms the fourth sub-pixel group.

7. The pixel structure according to claim 6, further comprising:
a bank layer on the pixel defining layer surrounding four sub-pixels of the first sub-pixel group adjacent to the first retention region and on the pixel defining layer surrounding four sub-pixels of the second sub-pixel group adjacent to the second retention region.

8. The pixel structure according to claim 6, wherein the first color light-emitting layer, the second color light-emitting layer, and the third color light-emitting layer are a red light-emitting layer, a green light-emitting layer, and a blue light-emitting layer, respectively,
and when the fourth color light-emitting layer is present, the fourth color light-emitting layer is a white light-emitting layer.

9. The pixel structure according to claim 6, wherein shapes of the first color light-emitting layer, the second color light-emitting layer, the third color light-emitting layer, and the first and second retention regions are all rectangular,
and when a fourth color light-emitting layer is present, a shape of the fourth color light-emitting layer is rectangular.

10. A production method for a pixel structure, comprising:
forming a pixel defining layer;
forming a first color light-emitting layer, a second color light-emitting layer, and a third color light-emitting layer in ranges defined by the pixel defining layer, so that the first color light-emitting layer, the second color light-emitting layer, and the third color light-emitting layer form the first sub-pixel group, the second sub-pixel group, and the third sub-pixel group in the pixel arrangement structure according to claim 1, respectively,
and when the pixel arrangement structure comprises the fourth sub-pixel group, the production method further comprises forming a fourth color light-emitting layer in a range of defined by the pixel defining layer, so that the fourth color light-emitting layer form the fourth sub-pixel group.

11. The production method according to claim 10, comprising:
forming the first color light-emitting layer by an evaporation method using a first mask plate, wherein an evaporation opening of the first mask plate is configured to form four sub-pixels of the first sub-pixel group surrounding the first retention region.

12. The production method according to claim 11, further comprising:
after evaporation of the first color light-emitting layer, moving the first mask plate, and forming the second color light-emitting layer by an evaporation method to form four sub-pixels of the second sub-pixel group surrounding the second retention region by the evaporation opening.

13. The production method according to claim 10, comprising:
forming the third color light-emitting layer by an evaporation method using a second mask plate, wherein an evaporation opening of the second mask plate is configured to form at least two adjacent sub-pixels of the third sub-pixel group.

14. The production method according to claim 10, comprising:
after forming the pixel defining layer, forming a bank layer on the pixel defining layer surrounding four sub-pixels of the first sub-pixel group adjacent to the first retention region and on the pixel defining layer surrounding four sub-pixels of the second sub-pixel group adjacent to the second retention region; and
forming the first color light-emitting layer and the second color light-emitting layer in a zone comprising the sub-pixels of the first sub-pixel group and a zone comprising the sub-pixels of the second sub-pixel group surrounded by the bank layer, respectively, by an inkjet printing method.

15. The production method according to claim 14, further comprising:
forming the third color light-emitting layer in a zone comprising the sub-pixels of the third sub-pixel group surrounded by the bank layer by an inkjet printing method.

16. An array substrate, comprising the pixel structure as claimed in claim 6.

17. A display panel, comprising the array substrate as claimed in claim 16.

\* \* \* \* \*